(12) United States Patent
Chang et al.

(10) Patent No.: US 8,304,895 B2
(45) Date of Patent: Nov. 6, 2012

(54) SEMICONDUCTOR PACKAGE AND METHOD OF FABRICATING THE SAME

(75) Inventors: Woojin Chang, Daejeon (KR); Soon Il Yeo, Daejeon (KR); Hae Cheon Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 210 days.

(21) Appl. No.: 12/764,330

(22) Filed: Apr. 21, 2010

(65) Prior Publication Data

US 2011/0049698 A1 Mar. 3, 2011

(30) Foreign Application Priority Data

Aug. 31, 2009 (KR) .................. 10-2009-0081157

(51) Int. Cl.
*H01L 23/053* (2006.01)
(52) U.S. Cl. . 257/700; 257/698; 257/723; 257/E23.009; 257/E23.172; 257/E23.173; 257/E23.178
(58) Field of Classification Search .................. 257/692, 257/693, 698, 700, 703, 723–725, E25.01, 257/E25.011, E25.012, E25.014–E25.016, 257/E25.003, E23.009, E23.172–E23.174, 257/E23.178
See application file for complete search history.

(56) References Cited

U.S. PATENT DOCUMENTS

| | | | | |
|---|---|---|---|---|
| 4,328,530 A * | 5/1982 | Bajorek et al. | ................ | 361/762 |
| 5,907,178 A * | 5/1999 | Baker et al. | ................... | 257/433 |
| 2002/0027011 A1 | 3/2002 | Park | | |
| 2006/0234560 A1* | 10/2006 | Farnworth et al. | ............ | 439/632 |
| 2007/0007645 A1* | 1/2007 | Yoon | ............................. | 257/723 |
| 2008/0224298 A1* | 9/2008 | Corisis et al. | ................. | 257/690 |

FOREIGN PATENT DOCUMENTS

| | | |
|---|---|---|
| JP | 2007-266139 A | 10/2007 |
| KR | 10-0331986 | 3/2002 |
| KR | 10-2008-0013937 A | 2/2008 |
| KR | 10-2009-0034081 A | 4/2009 |
| KR | 10-0895815 | 4/2009 |

* cited by examiner

*Primary Examiner* — Matthew E Warren
(74) *Attorney, Agent, or Firm* — Rabin & Berdo, P.C.

(57) ABSTRACT

A semiconductor package is provided. The semiconductor package includes a package body, a plurality of semiconductor chips, and an external connection terminal. The package body is stacked with a plurality of sheets where conductive patterns and vias are disposed. The plurality of semiconductor chips are inserted into insert slots extending from one surface of the package body. The external connection terminal is provided on other surface opposite to the one surface of the package body. Here, the plurality of semiconductor chips are electrically connected to the external connection terminal.

13 Claims, 16 Drawing Sheets

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2009-0081157, filed on Aug. 31, 2009, the entire contents of which are hereby incorporated by reference.

BACKGROUND OF THE INVENTION

The present invention disclosed herein relates to a semiconductor package, and more particularly, to a semiconductor package using a Low Temperature Cofired Ceramic (LTCC) technology.

Recently, technologies of miniaturization and high-performance are required to realize electronic products. To implement the miniaturization and high-performance, demands on lamination technologies for packaging various integrated circuit and passive elements in one module using a system-in-package process are increasing.

LTCC technologies may be defined as technologies of manufacturing a multi-chip module, in which internal electrodes and passive elements are printed on a plurality of green sheet layers mainly formed of glass-ceramic materials to implement a desired circuit, and respective layers are stacked and cofired.

LTCC technologies may realize circuit boards and complex modules having high functionality and high reliability. In its early stages, LTCC technologies were expected to be developed and distributed for various purposes, but were limitedly used only in fields such as super computer or aerospace requiring special reliability. Also, LTCC technology market has not been expanded as expected due to typical resin multi-layered substrates. However, recently, as the mobile communication market is explosively expanded, LTCC technologies are used as the most powerful means to realize miniaturization, cost reduction, high-functionality of a high-frequency analog circuit.

Typical ceramic multi-layer substrates formed of alumina require a high-firing temperature, whereas LTCC technologies enable lower-temperature firing by adding glass-based materials. By lowering the firing temperature, high conductive metals having economical efficiencies and low melting points may be used as materials for interlayer interconnection. Also, LTCC technologies have an advantage of implementing an originally-designed circuit as it is by inhibiting contraction of a green sheet in x- or y-axis direction.

LTCC technologies are used for products such as power amplifier modules, automotive engine control units (ECUs), band pass filters, micro antennas, and wireless interfaces such as mobile phones, thereby producing products of high frequency, high reliability, low cost, miniaturization, and low power consumption.

SUMMARY OF THE INVENTION

The present invention provides a structure mounted with a plurality of chips using a LTCC technology.

The object of the present invention is not limited to the aforesaid, but other objects not described herein will be clearly understood by those skilled in the art from descriptions below.

Embodiments of the present invention provide semiconductor packages including: a package body stacked with a plurality of sheets where conductive patterns and vias are disposed; a plurality of semiconductor chips inserted into insert slots extending from one surface of the package body; and an external connection terminal provided on other surface opposite to the one surface of the package body, wherein the plurality of semiconductor chips are electrically connected to the external connection terminal.

In some embodiments, the one surface of the package body may expose one sides of the plurality of semiconductor chips. Also, the insert slot may extend in a plane shape vertical to the one surface of the package body.

In other embodiments, the plurality of semiconductor chips may penetrate the plurality of sheets. Also, the semiconductor package may further include a protection sheet provided on the one surface of the package body to cover the insert slot.

In still other embodiments, the insert slots may be provided between the plurality of sheets. The conductive pattern may contact the external connection terminal to electrically connect the plurality of semiconductor chips to the external connection terminal. The via may connect the plurality of semiconductor chips electrically.

In other embodiments of the present invention, methods of fabricating semiconductor packages include: forming a package body stacked with a plurality of sheets where conductive patterns and vias are formed; forming insert slots extending from one surface of the package body; inserting a plurality of semiconductor chips into the insert slots; and forming an external connection terminal on other surface opposite to the one surface of the package body and electrically connecting the plurality of semiconductor chips to the external connection terminal using the conductive pattern and the via.

In some embodiments, the forming of the insert slot may include performing a laser process after the plurality of sheets are stacked, or stacking the plurality of sheets after each of the plurality of sheets is punched. The forming of the insert slot may include penetrating the plurality of sheets.

In other embodiments, the forming of the insert slot may include stacking the plurality of sheets after recess regions are formed in each of the plurality of sheets.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
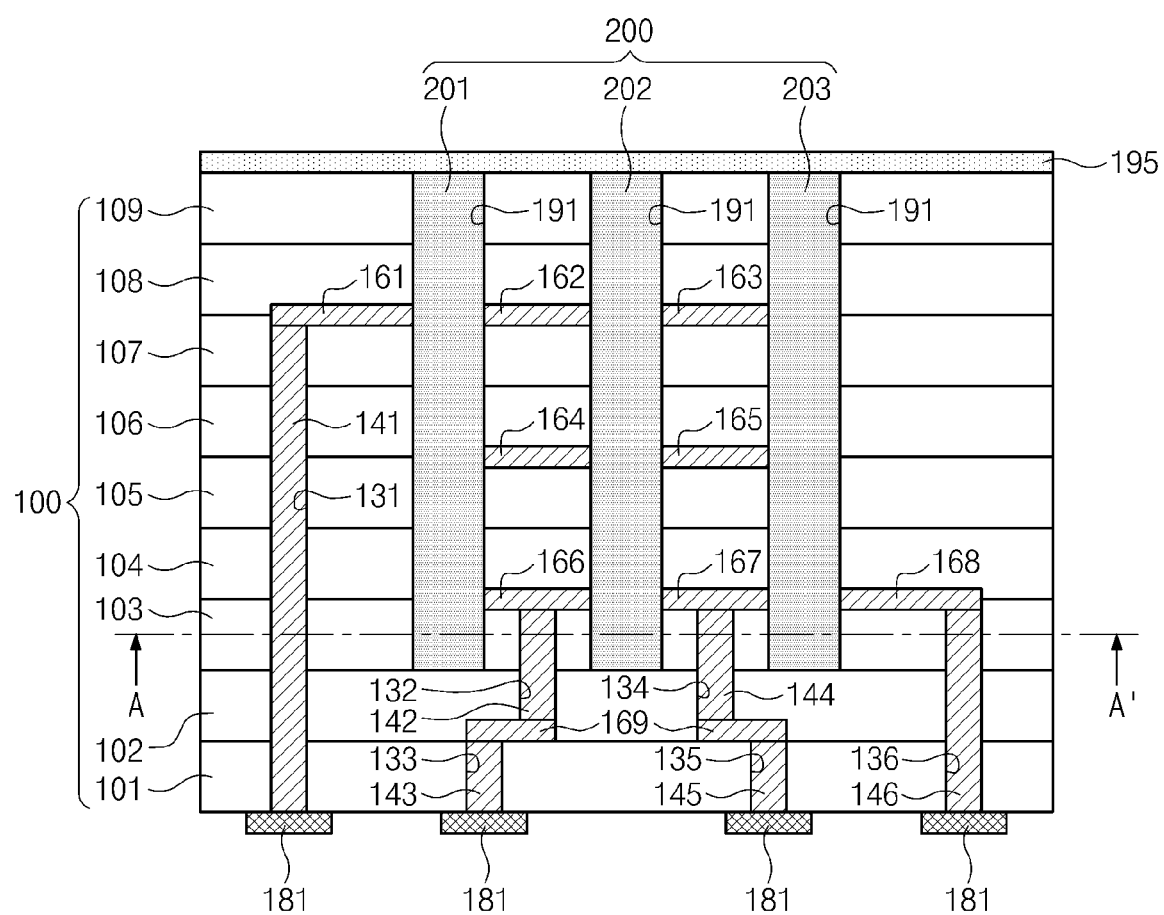
FIGS. 1 and 2 are cross-sectional views illustrating a semiconductor package according to a first embodiment.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the specification, it will be understood that when a material layer (or film) such as a conductive layer, a semiconductor layer, or an insulating layer is referred to as being 'on' another material layer or substrate, it can be directly on the other layer or substrate, or intervening layers may also be present. Though terms like a first, a second, and a third are used to describe various regions and layers in various embodiments of the present invention, the regions and the layers are not limited to these terms.

In the following description, the technical terms are used only for explaining a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, etching areas illustrated to be right-angled may have a round shape or a certain curvature. Areas exemplified in the drawings have general properties, and are used to illustrate a specific shape of a semiconductor package region. Thus, this should not be construed as limited to the scope of the present invention.

(First Embodiment)

Figure 4:
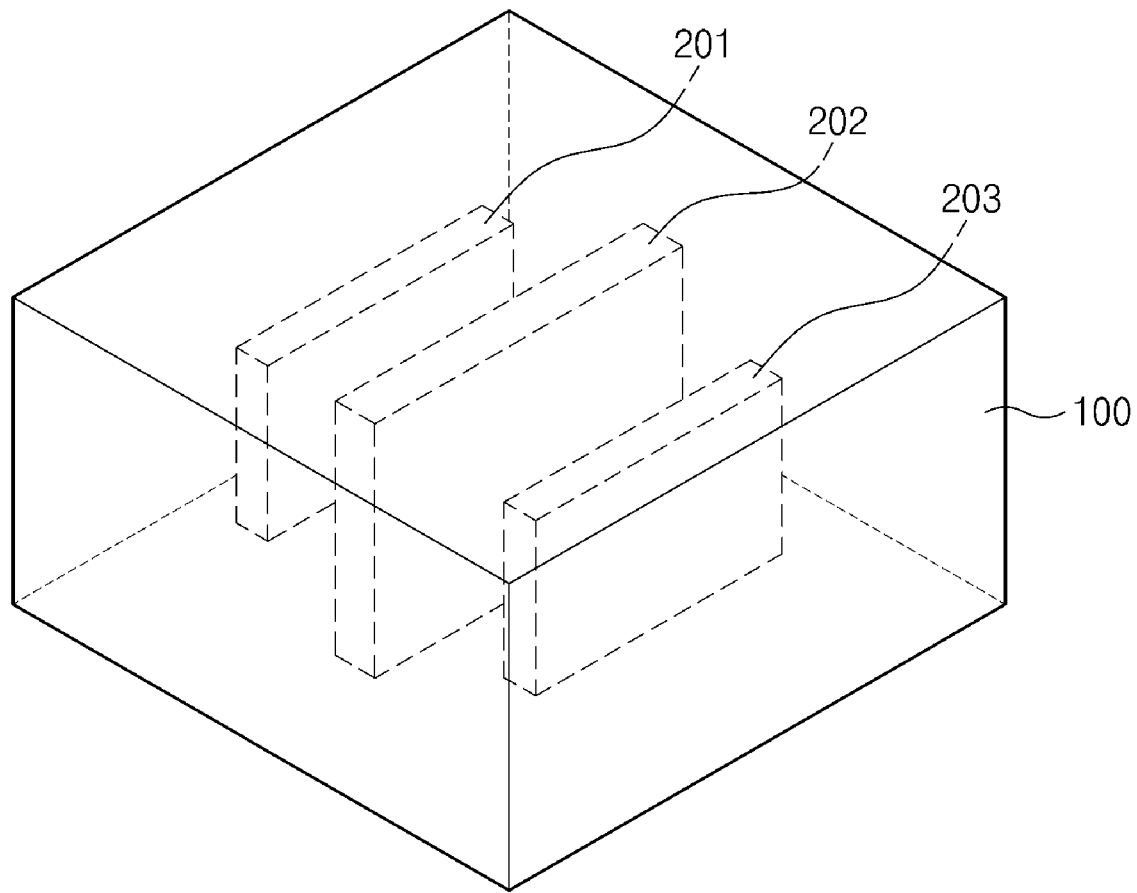

FIGS. 1 and 4 are diagrams illustrating a semiconductor package according to a first embodiment.

Figure 2:
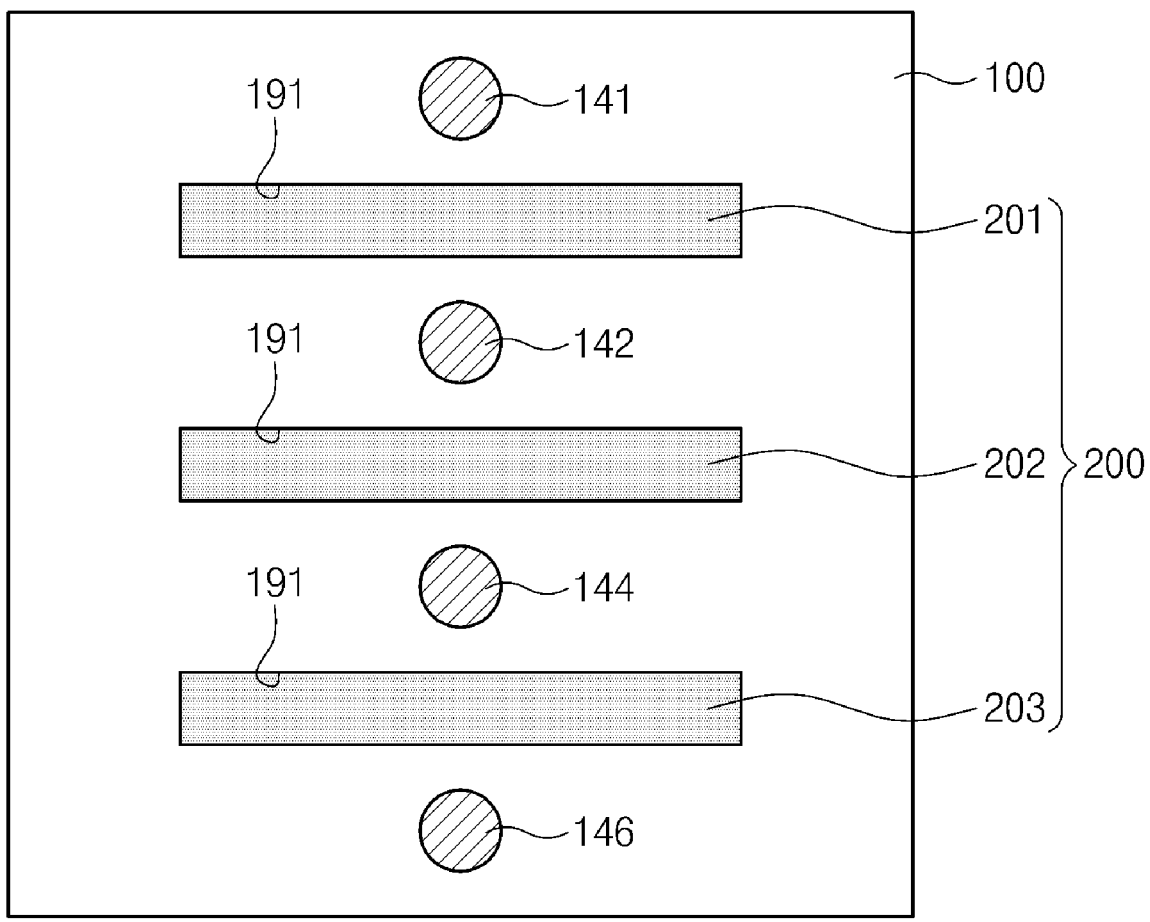

Referring to FIGS. 1 and 2, a package body 100 having a plurality of sheets 101 to 109 stacked therein is provided. The plurality of sheets 101 to 109 may be Low Temperature Cofired Ceramic (LTCC) green sheets. First to sixth vias 141 to 146 are provided in the package body 100. The first to sixth vias 141 to 146 may be provided in first to sixth via holes 131 to 136, respectively. The first to sixth vias 141 to 146 may be extended through the plurality of sheets 101 to 109. As an example, the first and sixth vias 141 to 146 may be vertical to contact surfaces between the plurality of sheets 101 to 109. Conductive patterns are provided between the plurality of sheets 101 to 109. The conductive patterns may include first to ninth conductive patterns 161 and 169.

An external connection terminal 181 may be provided at a lower part of the first sheet 101. The external connection terminal 181 may be provided for electrical connection to external devices.

An insert slot 191 is provided in the package body 100. The insert slot 191 may be extended from one surface of the package body 100. The insert slot 191 may penetrate the plurality of sheets 101 to 109. As an example, the insert slot 191 may be vertical to the contact surfaces between the plurality of sheets 101 to 109. The insert slot 191 may have a shape corresponding to a plurality of semiconductor chips that will be described below. A plurality of insert slots 191 may be formed.

FIG. 2 is a cross-sectional view taken along line A-A' of FIG. 1. Referring to FIGS. 1 and 2, a plurality of semiconductor chips 200 may be provided in the insert slot 191. The package body 100 may expose one sides of the plurality of semiconductor chips 200 at one surface thereof. The plurality of semiconductor chips 200 may include a first chip 201, a second chip 202, and a third chip 203. The insert slot 191 may have a shape corresponding to the plurality of semiconductor chips 200. The plurality of semiconductor chips 200 may be inserted through the third to ninth sheets 103 to 109. At least one of the plurality of semiconductor chips 200 may have different size or different function. Accordingly, chips having various functions may be mounted in one package.

The plurality of semiconductor chips 200 and the external connection terminal 181 may be electrically connected to each other. The external connection terminal 181 may contact the first via 141, the third via 143, the fifth via 145, and the sixth via 146. The first chip 201 may be electrically connected to the external connection terminal 181 through the first via 141 and the first conductive pattern 161. The third chip 203 may be electrically connected to the external connection terminal 181 through the sixth via 146 and the eighth conductive pattern 168. The second conductive pattern 162 and the fourth conductive pattern 164 may connect the first chip 201 to the second chip 202 electrically. The third conductive pattern 163 and the fifth conductive pattern 165 may connect the second chip 202 to the third chip 203 electrically. The first chip 201 and the second chip 202 may be electrically connected to the external connection terminal 181 through the sixth conductive pattern 166, the ninth conductive pattern 169, the second via 142, and the third via 143. The second chip 202 and the third chip 203 may be electrically connected to the external connection terminal 181 through the seventh conductive pattern 167, the ninth conductive pattern 169, the fourth via 144, and the fifth via 145. Interconnections in the plurality of sheets may not be limited to the form of interconnections shown in FIG. 1. Electrical connection without a bonding wire may be enabled by interconnection through the vias and conductive patterns. Accordingly, reduction of semiconductor chip characteristics due to parasitic components may be prevented.

A protection sheet 195 may be further provided on the package body 100. The protection sheet 195 may cover the exposed side one of the plurality of semiconductor chips 200 to protect the plurality of semiconductor chips 200 from the outside. As an example, the protection sheet 195 may be formed of resin.

Figure 3:
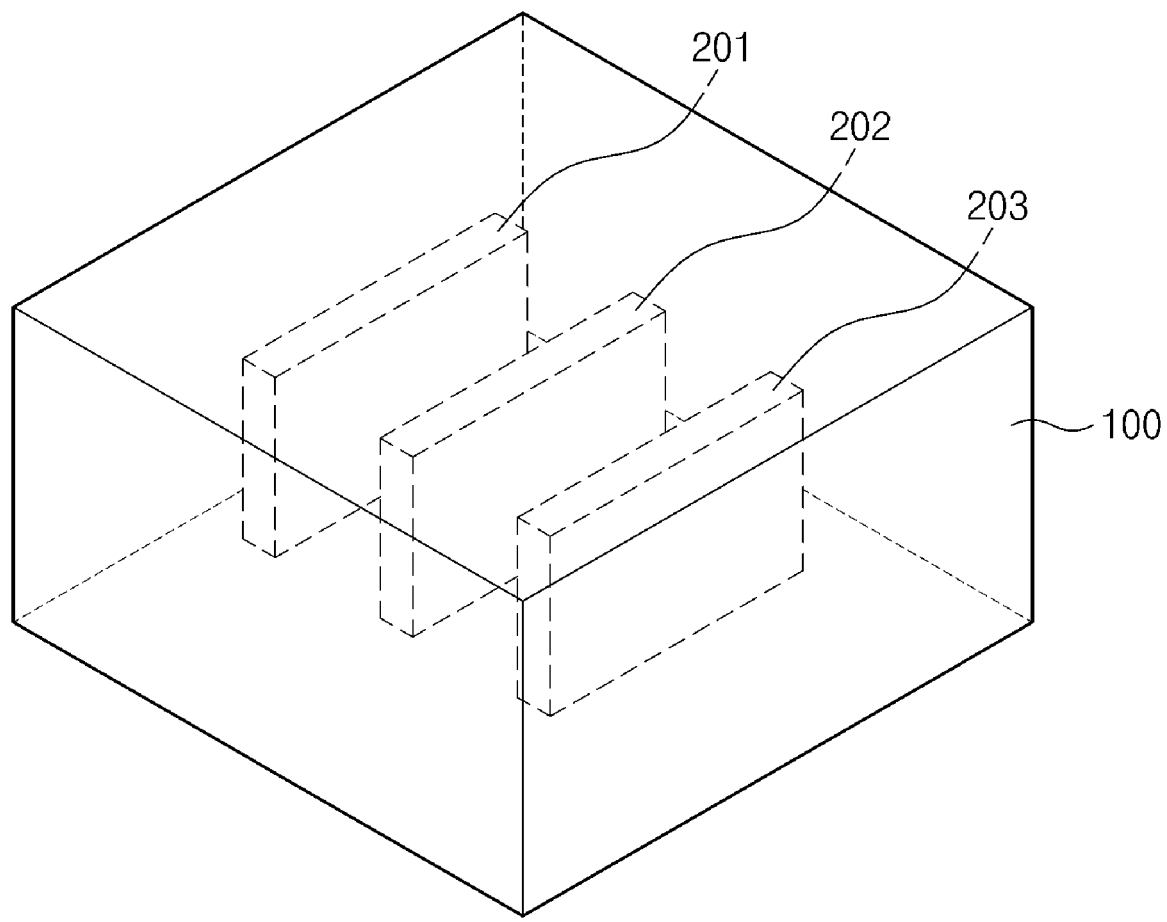
FIGS. 3 and 4 are perspective views illustrating a mounting structure of a plurality of semiconductor chips according to embodiments.

FIGS. 3 and 4 are perspective views illustrating a mounting structure of a plurality of semiconductor chips 200 according to a first embodiment. FIG. 3 shows that semiconductor chips having the same size are mounted in the package body 100. FIG. 4 shows that semiconductor chips having different sizes from each other are mounted in the package body 100. Interconnection may be changed according to the shapes of the plurality of semiconductor chips 200. Since interconnection may be changed according to positions of pads (not shown) of the plurality of semiconductor chips 200, the positions and number of the pads of the semiconductor chips may be freely selected when the semiconductor chip is designed. Accordingly, it becomes easier to package semiconductor chips having different sizes and functions together. An unnecessary routing to dispose a pad of a semiconductor chip is omitted, reducing the size of the semiconductor chip.

Figure 5:
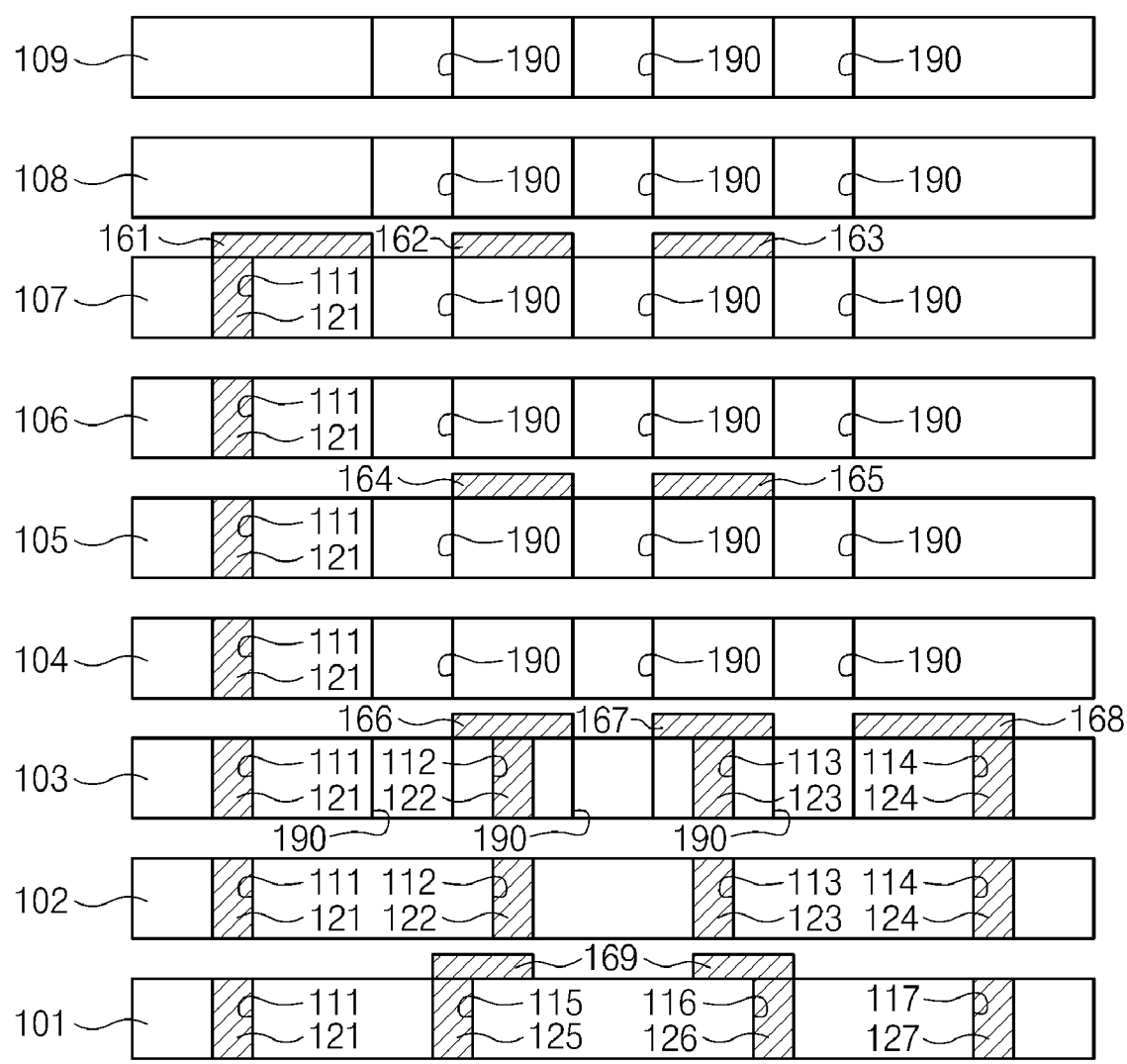
FIGS. 5 through 7 are cross-sectional views illustrating a method of fabricating a semiconductor package according to a first embodiment.
Figure 6:
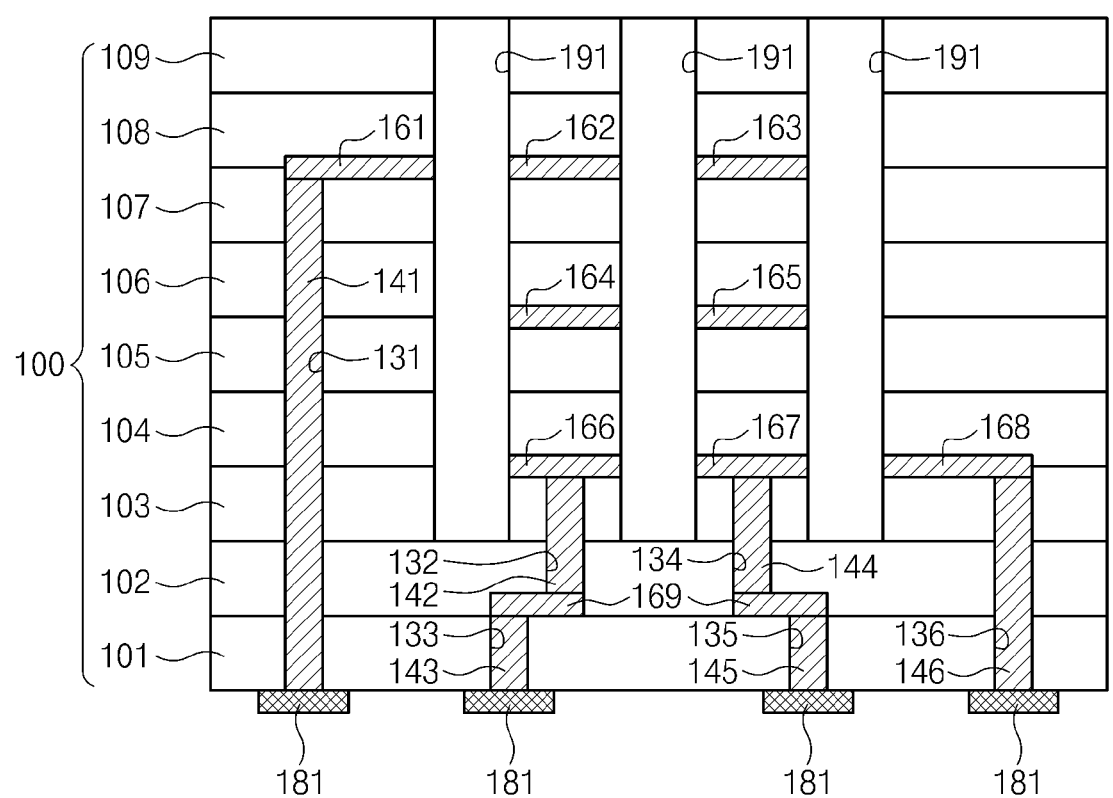
Figure 7:
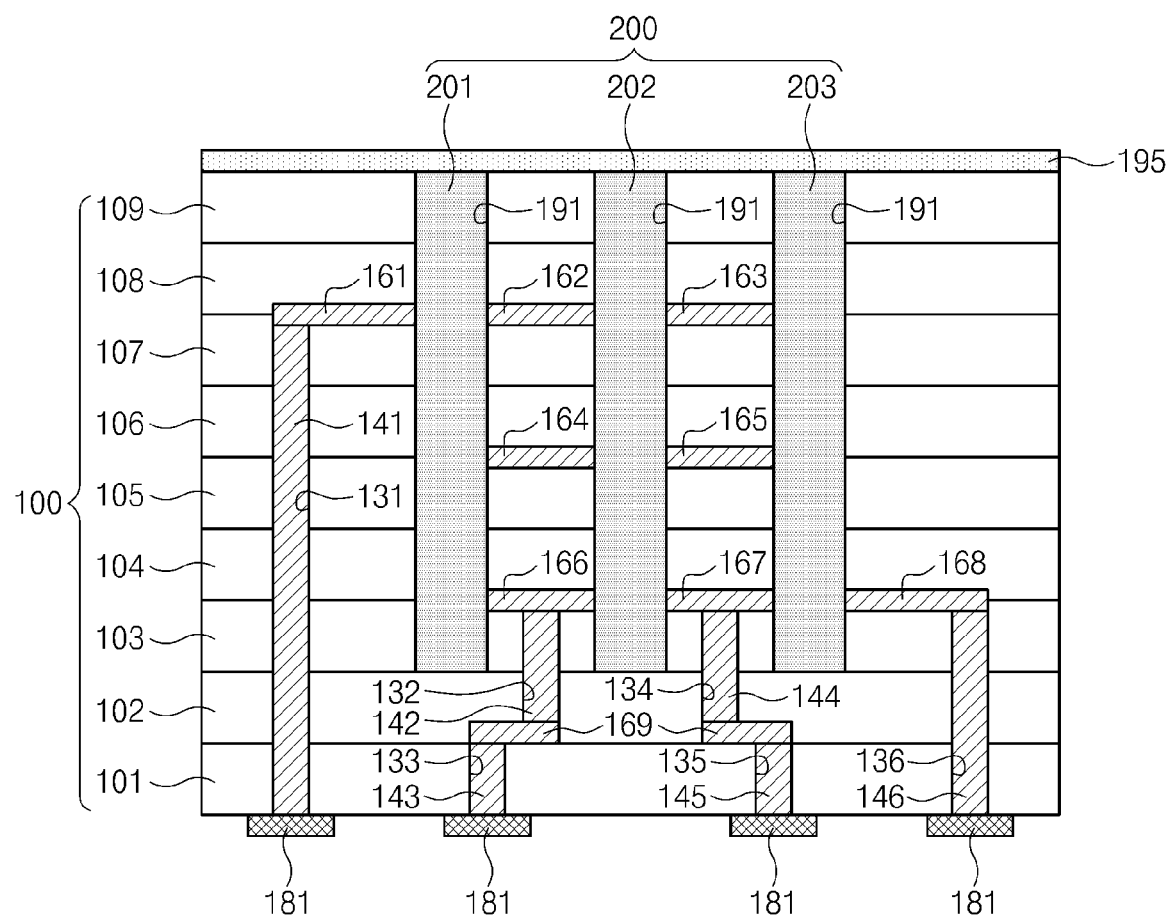

FIGS. 5 through 7 are cross-sectional views illustrating a method of fabricating a semiconductor package according to a first embodiment.

Referring to FIG. 5, a plurality of sheet 101 to 109 are provided. The plurality of sheets 101 to 109 may be green sheets. The green sheet may be formed of a material mixed with a certain ratio of ceramic powers, dispersing agents, solvents, polymer binders, plasticizers, and other additives if necessary. Vias or conductive patterns may be formed in each sheet. First preliminary via hole 111 may be formed in the first to seventh sheets 101 to 107. The first preliminary via hole 111 may be formed by punching or laser-processing each sheet. A first preliminary via 121 may be formed by filling conductive paste in the first preliminary via hole 111. A second preliminary via hole 112, a third preliminary via hole 113, and a fourth preliminary via hole 114 may be formed in the second sheet 102 and the third sheet 103, respectively. A second via 122, a third via 123, and a fourth via 124 may be formed in the second preliminary via hole 112, the third preliminary via hole 113, and the fourth preliminary via hole 114, respectively. A fifth preliminary via hole 115, a sixth preliminary via hole 116, and a seventh preliminary via hole 117 may be formed in the first sheet 101. A fifth via 125, a sixth via 126, and a seventh via 127 may be formed in the fifth via hole 115, the sixth via hole 116, and the seventh via hole 117, respectively. Preliminary insert slots 190 may be formed in the third to ninth sheets 103 to 109. The preliminary insert slots 190 may be formed by punching the respective sheets.

Conductive patterns 161 to 169 may be formed on the plurality of sheets 101 to 109. The ninth conductive pattern 169 may be formed on the first sheet 101. The sixth to eighth conductive patterns 166 to 168 may be formed on the third sheet 103. The fourth and fifth conductive patterns 164 and 165 may be formed on the fifth sheet 105. The first to third conductive patterns 161 to 163 may be formed on the seventh sheet 107. The conductive patterns 161 to 169 may include at least one conductive material selected from the group consisting of Au, Ag, and Cu. The conductive pattern or preliminary conductive pattern may be formed through a typical LTCC process such as screen printing and inkjet printing.

Referring to FIG. 6, a firing process may be performed in a state that the plurality of sheets 101 to 109 are stacked. The firing process may be performed at a low temperature of about 1,000° C. or less like a typical LTCC process. Through the process, a package body 100 may be formed, and the preliminary vias are connected to form first to sixth vias 141 to 146. Also, the preliminary insert slots 190 are connected to form an insert slot 191. The insert slot 191 may be vertical to contact surfaces between the plurality of sheets 101 to 109. An external connection terminal 181 may be formed at the package body 100.

Referring to FIG. 7, a plurality of semiconductor chips 200 may be inserted into the insert slots 191. Pads (not shown) of the plurality of semiconductor chips 200 may be electrically connected to the conductive patterns 161 to 168. As an example, before the semiconductor chips 200 are inserted into the insert slots 191 for electrical connection, conductive paste may be coated on the pads of the semiconductor chips 200. The conductive paste serves to connect the plurality of semiconductor chips 200 and the conductive patterns 161 to 168 electrically through a heating process.

A protection sheet 195 may be further formed on exposed sides of the plurality of semiconductor chips 200. The protection sheet 195 covers the exposed surface of the plurality of semiconductor chips 200 to protect the plurality of semiconductor chips 200 from the outside. As an example, the protection sheet 195 may be formed of resin. A semiconductor package mounted with the plurality of semiconductor chips 200 may enable electrical connection between the semiconductor chips and the package using conductive metal interconnection, not a bonding wire.

(Second Embodiment)

FIGS. 8 through 11 are cross-sectional views illustrating a method of fabricating a semiconductor package according to a second embodiment. Technical features of this embodiment are similar to those of the first embodiment except a difference of a method of forming an insert slot. Accordingly, for simplicity of explanation, detailed description of the similar technical features will be omitted below.

Figure 8:
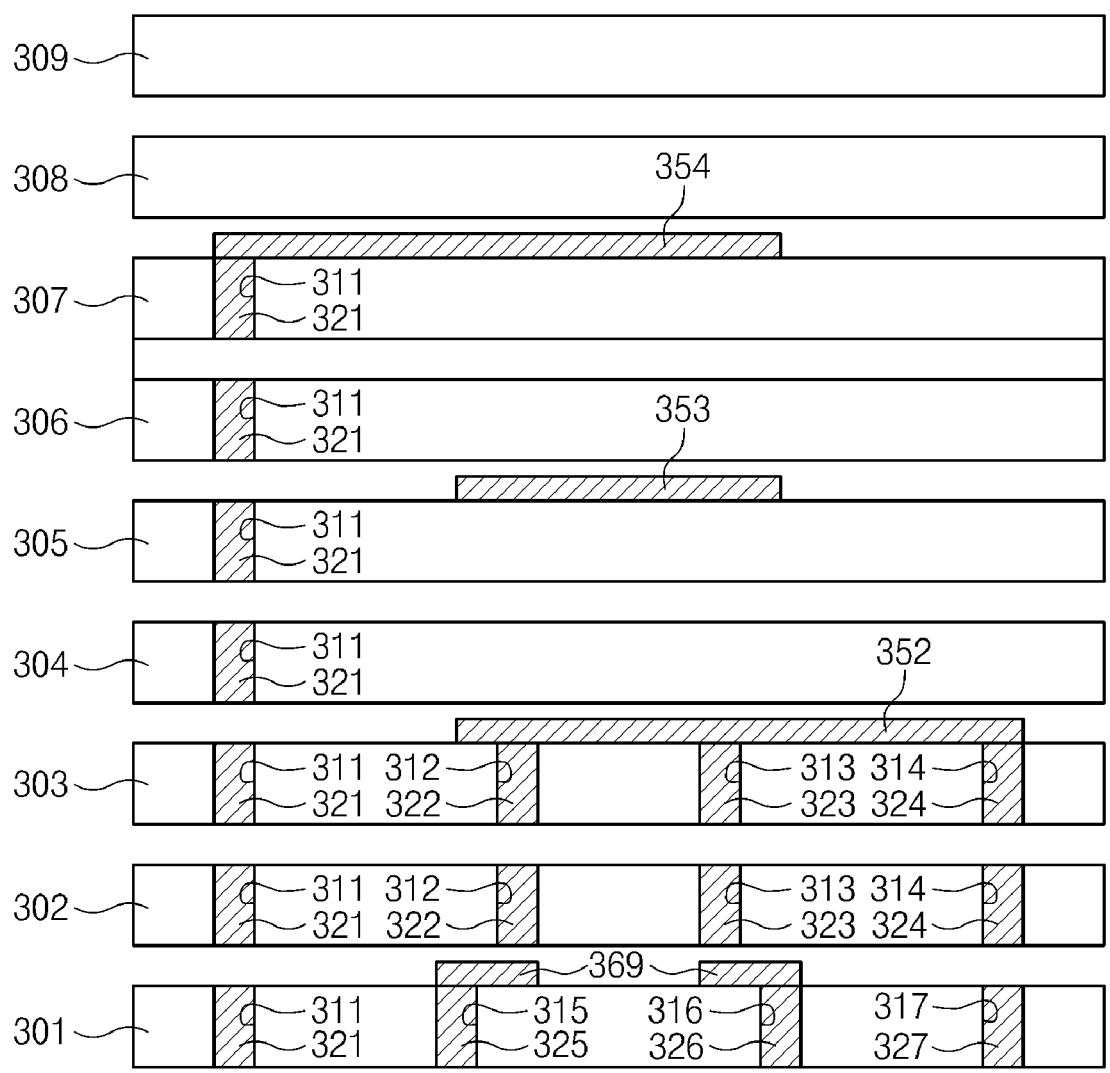
FIGS. 8 through 11 are cross-sectional views illustrating a method of fabricating a semiconductor package according to a second embodiment.

Referring to FIG. 8, a plurality of sheets 301 to 309 are provided. The plurality of sheets 301 to 309 may be green sheets. The green sheet may be formed of a material mixed with a certain ratio of ceramic powers, dispersing agents, solvents, polymer binders, plasticizers, and other additives if necessary. Vias or conductive patterns may be formed in each sheet. First preliminary via hole 311 may be formed in the first to seventh sheets 301 to 307. The first preliminary via hole 311 may be formed by punching or laser-processing each sheet. A first preliminary via 321 may be formed by filling conductive paste in the first preliminary via hole 311. A second preliminary via hole 312, a third preliminary via hole 313, and a fourth preliminary via hole 314 may be formed in the second sheet 302 and the third sheet 303, respectively. A second via 322, a third via 323, and a fourth via 324 may be formed in the second preliminary via hole 312, the third preliminary via hole 313, and the fourth preliminary via hole 314, respectively. A fifth preliminary via hole 315, a sixth preliminary via hole 316, and a seventh preliminary via hole 317 may be formed in the first sheet 301. A fifth via 325, a sixth via 326, and a seventh via 327 may be formed in the fifth via hole 315, the sixth via hole 316, and the seventh via hole 317, respectively.

Conductive patterns and preliminary conductive patterns may be formed on the plurality of sheets 301 to 309. The ninth conductive pattern 369 and the second preliminary conductive pattern 352 may be formed on the first sheet 301 and the third sheet 303, respectively. The third preliminary conductive pattern 353 and the fourth preliminary conductive pattern 354 may be formed on the fifth sheet 305 and the seventh sheet 307, respectively. The conductive patterns and the preliminary conductive patterns may include at least one conductive material selected from the group consisting of Au, Ag, and Cu. The conductive pattern or preliminary conductive pattern may be formed through a typical LTCC process such as screen printing and inkjet printing.

Figure 9:
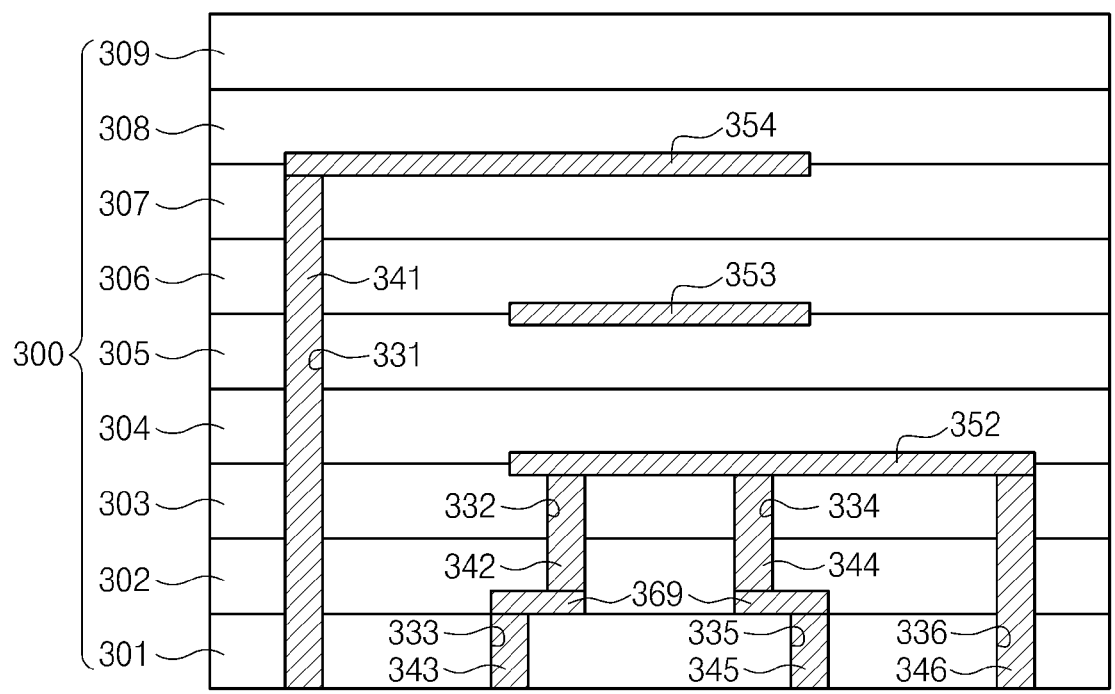

Referring to FIG. 9, a firing process may be performed in a state that the plurality of sheets 301 to 309 are stacked. The firing process may be performed at a low temperature of about 1,000° C. or less like a typical LTCC process. Through the process, a package body 300 may be formed, and the preliminary vias are connected to form first to sixth vias 341 to 346.

Figure 10:
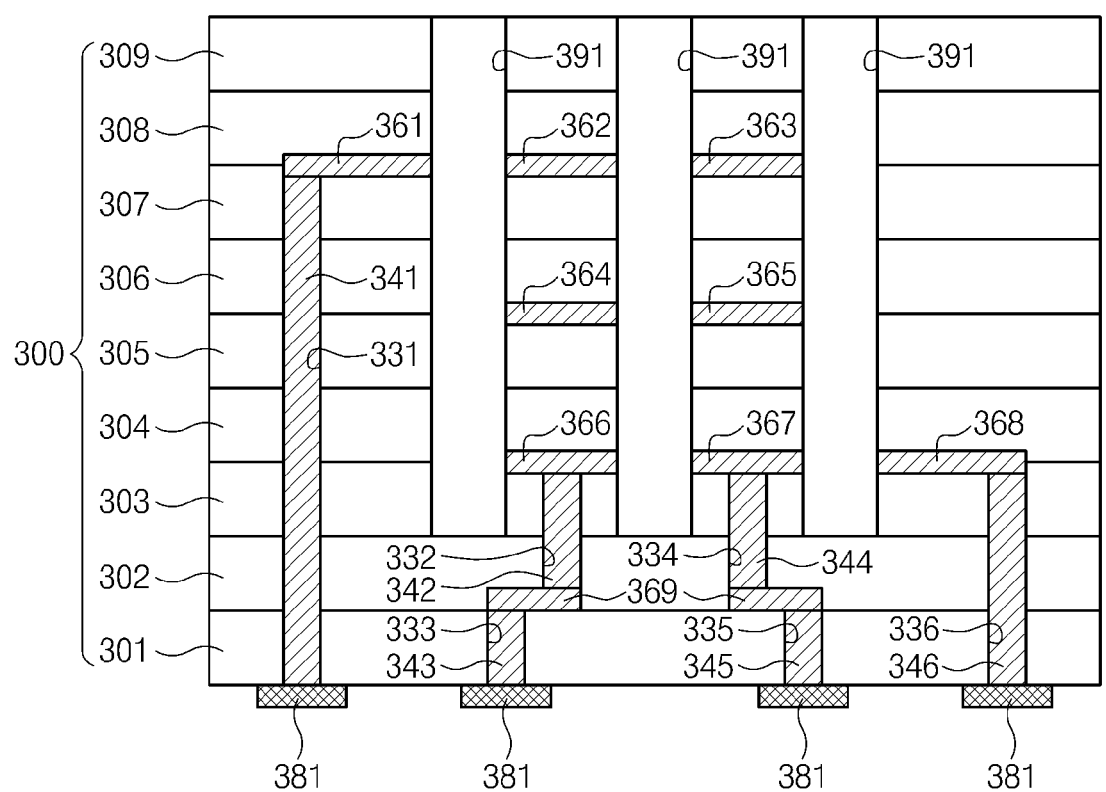

Referring to FIG. 10, insert slots 391 are formed in one surface of the package body 300. The insert slots 391 may be formed through a laser process. The insert slots 391 may be formed to penetrate the plurality of sheets 301 to 309. The insert slots 391 may be vertical to contact surface between the plurality of sheets 301 to 309. The preliminary conductive patterns 352 to 354 may be separated by the forming of the insert slots 391, thereby forming conductive patterns 361 to 368. External connection terminals 381 may be formed on an opposite side of the surface of the package body 300.

Figure 11:
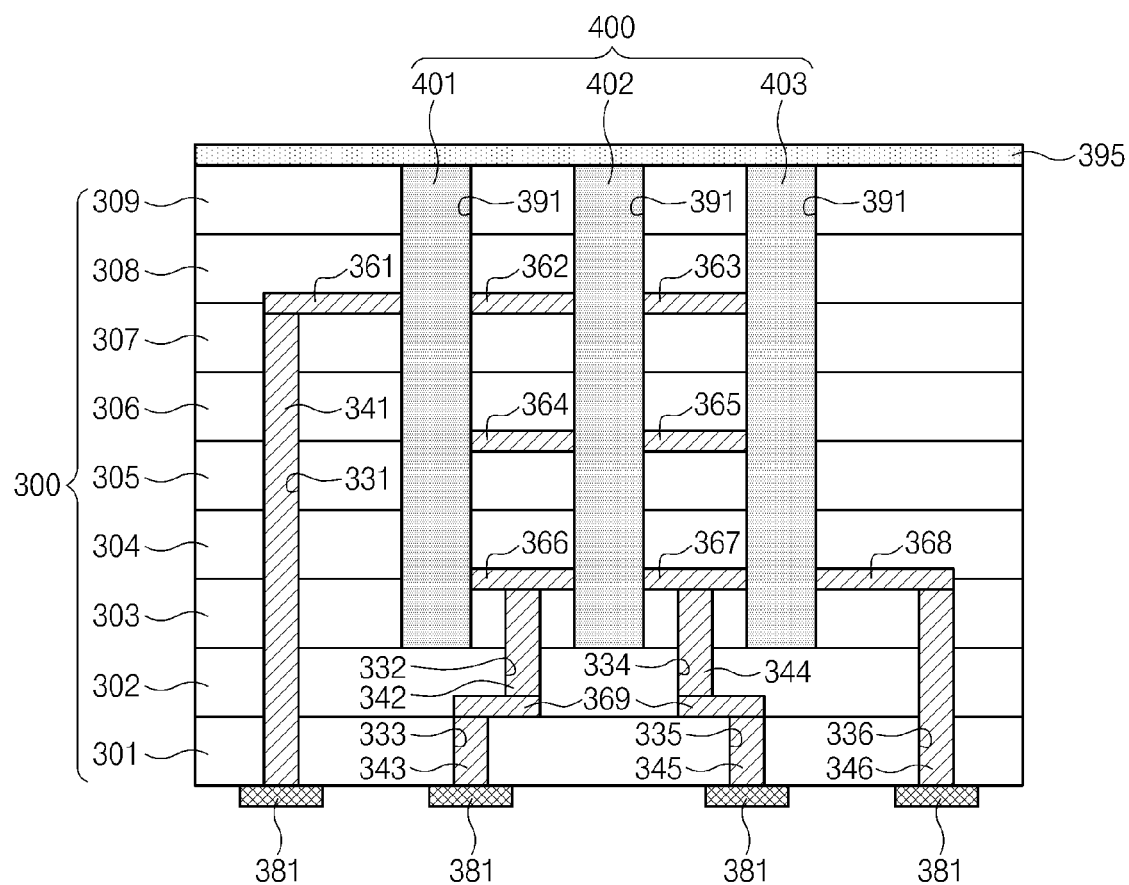

Referring to FIG. 11, a plurality of semiconductor chips 400 may be inserted into the insert slots 391. Pads (not shown) of the plurality of semiconductor chips 400 may be electrically connected to the conductive patterns 361 to 368. As an example, before the semiconductor chips 400 are inserted into the insert slots 391 for electrical connection, conductive paste may be coated on the pads of the semiconductor chips 400. The conductive paste serves to connect the plurality of semiconductor chips 400 and the conductive patterns 361 to 368 electrically through a heating process.

A protection sheet 395 may be further formed on exposed sides of the plurality of semiconductor chips 400. The protection sheet 395 covers the exposed surface of the plurality of semiconductor chips 400 to protect the plurality of semiconductor chips 400 from the outside. As an example, the protection sheet 395 may be formed of resin. A semiconductor package mounted with the plurality of semiconductor chips 400 may enable electrical connection between the semiconductor chips and the package using conductive metal interconnection, not a bonding wire.

(Third Embodiment)

FIGS. 12 through 16 are cross-sectional views illustrating a semiconductor package according to a third embodiment. Technical features of this embodiment are similar to those of the first embodiment except differences between shapes of package bodies and interconnections. Accordingly, for simplicity of explanation, detailed description of the similar technical features will be omitted below.

Figure 12:
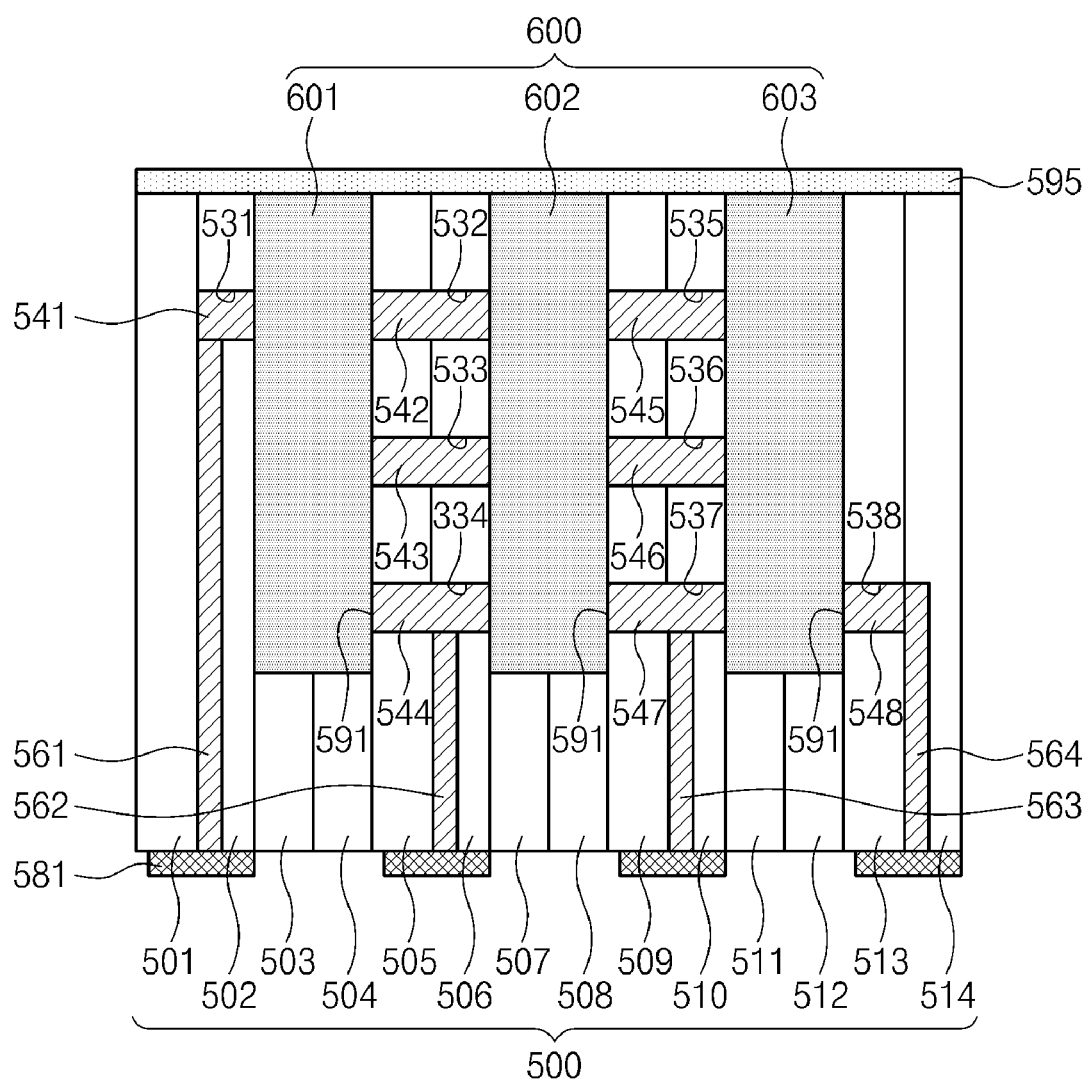
FIGS. 12 through 16 are cross-sectional views illustrating a method of fabricating a semiconductor package according to a third embodiment.

Referring to FIG. 12, a package body 500 having a plurality of sheets 501 to 514 stacked therein is provided. The plurality of sheets 501 to 514 may be LTCC green sheets. First to eighth vias 541 to 548 are provided in the package body 500. The first to eighth vias 541 to 548 may be provided in first to eighth via holes 531 to 538, respectively. The first to eighth vias 541 to 548 may be extended through the plurality of sheets 501 to 514. As an example, the first and eighth vias 541 to 548 may be vertical to contact surfaces between the plurality of sheets 501 to 514. Conductive patterns are provided between the plurality of sheets 501 to 514. The conductive patterns may include first to fourth conductive patterns 561 and 564.

An external connection terminal 181 may be provided on the undersurface of the package body 500. The undersurface may include side surfaces of the plurality of sheets 501 to 514. The external connection terminal 581 may be provided for electrical connection to external devices.

An insert slot 591 is provided in the package body 500. The insert slot 591 may be extended from one surface of the package body 500. In the third embodiment, the insert slot 591 may be provided between the plurality of sheets 501 to 514. As an example, the insert slot 591 may be parallel to the contact surfaces between the plurality of sheets 501 to 514. The insert slot 591 may have a shape corresponding to a plurality of semiconductor chips that will be described below. A plurality of insert slots 591 may be formed.

A plurality of semiconductor chips 600 may be provided in the insert slot 591. The package body 500 may expose one sides of the plurality of semiconductor chips 600 at one surface thereof. The plurality of semiconductor chips 600 may include a first chip 601, a second chip 602, and a third chip 603. The insert slot 591 may have a shape corresponding to the plurality of semiconductor chips 600. At least one of the plurality of semiconductor chips 600 may have different size or different function. Accordingly, chips having various functions may be mounted in one package.

The plurality of semiconductor chips 600 and the external connection terminal 581 may be electrically connected to each other. The external connection terminal 581 may contact the first to fourth conductive patterns 561 to 564. The first chip 601 may be electrically connected to the external connection terminal 581 through the first via 541 and the first conductive pattern 561. The third chip 603 may be electrically connected to the external connection terminal 581 through the eighth via 548 and the fourth conductive pattern 564. The second via 542 and the third via 543 may connect the first chip 601 and the second chip 602 electrically. The fifth via 545 and the sixth via 546 may connect the second chip 602 the third chip 603 electrically. The first chip 601 and the second chip 602 may be electrically connected to the external connection terminal 581 through the fourth via 544 and the second conductive pattern 562. The second chip 602 and the third chip 603 may be electrically connected to the external connection terminal 581 through the seventh via 547 and the third conductive pattern 563. Interconnections in the plurality of sheets may not be limited to the form of interconnections shown in FIG. 12. Electrical connection without a bonding wire may be enabled by interconnection through the vias and conductive patterns. Accordingly, reduction of semiconductor chip characteristics due to parasitic components may be prevented.

A protection sheet 595 may be further provided on the package body 500. The protection sheet 595 may cover the exposed side one of the plurality of semiconductor chips 600 to protect the plurality of semiconductor chips 600 from the outside. As an example, the protection sheet 195 may be formed of resin.

FIGS. 13 through 16 are diagram illustrating a method of fabricating a semiconductor package according to a third embodiment.

Figure 13:
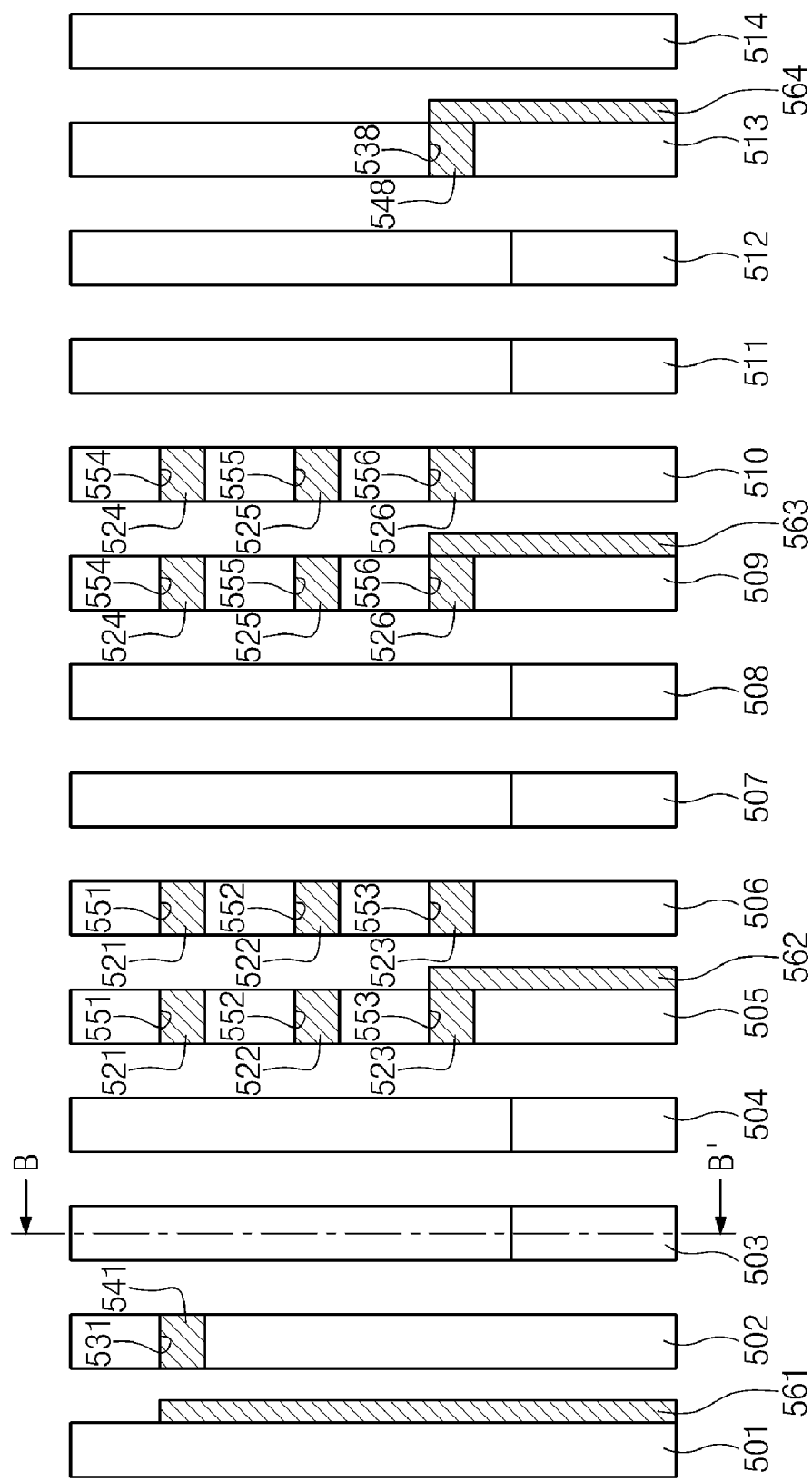

Referring to FIG. 13, a plurality of sheet 501 to 514 are provided. The plurality of sheets 501 to 514 may be green sheets. The green sheet may be formed of a material mixed with a certain ratio of ceramic powers, dispersing agents, solvents, polymer binders, plasticizers, and other additives if necessary. Vias or conductive patterns may be formed in each sheet. A first via hole 531 may be formed in the second sheet 502. The first via hole 531 may be formed by punching or laser-processing a green sheet. A first via 541 may be formed by filling conductive paste in the first via hole 531. After a eighth via hole 538 is formed in the thirteenth sheet 513, conductive paste may be filled to form an eighth via 548. A first preliminary via hole 551, a second preliminary via hole 552, a third preliminary via hole 553 may be formed in the fifth sheet 505 and the sixth sheet 506. A first via 521, a second via 522, and a third via 523 may be formed in the second preliminary via hole 551, the second preliminary via hole 552, and the third preliminary via hole 553. A fourth preliminary via hole 554, a fifth preliminary via hole 555, and a sixth preliminary via hole 556 may be formed in the ninth sheet 509 and the tenth sheet 510. A fourth via 524, a fifth via 525, and a sixth via 526 may be formed in the fourth via hole 554, the fifth via hole 555, and the sixth via hole 556.

Conductive patterns 561 to 564 may be formed on the plurality of sheets. In the third embodiment, the first conductive pattern 561 and the second conductive pattern 562 may be formed on the first sheet 501 and the fifth sheet 505, respectively. The third conductive pattern 563 and the fourth conductive pattern 564 may be formed on the ninth sheet 509 and the thirteen sheet 513, respectively. The conductive patterns 561 to 564 may include at least one conductive material selected from the group consisting of Au, Ag, and Cu. The conductive patterns 561 to 564 may be formed through a typical LTCC process such as screen printing and inkjet printing.

Figure 14:
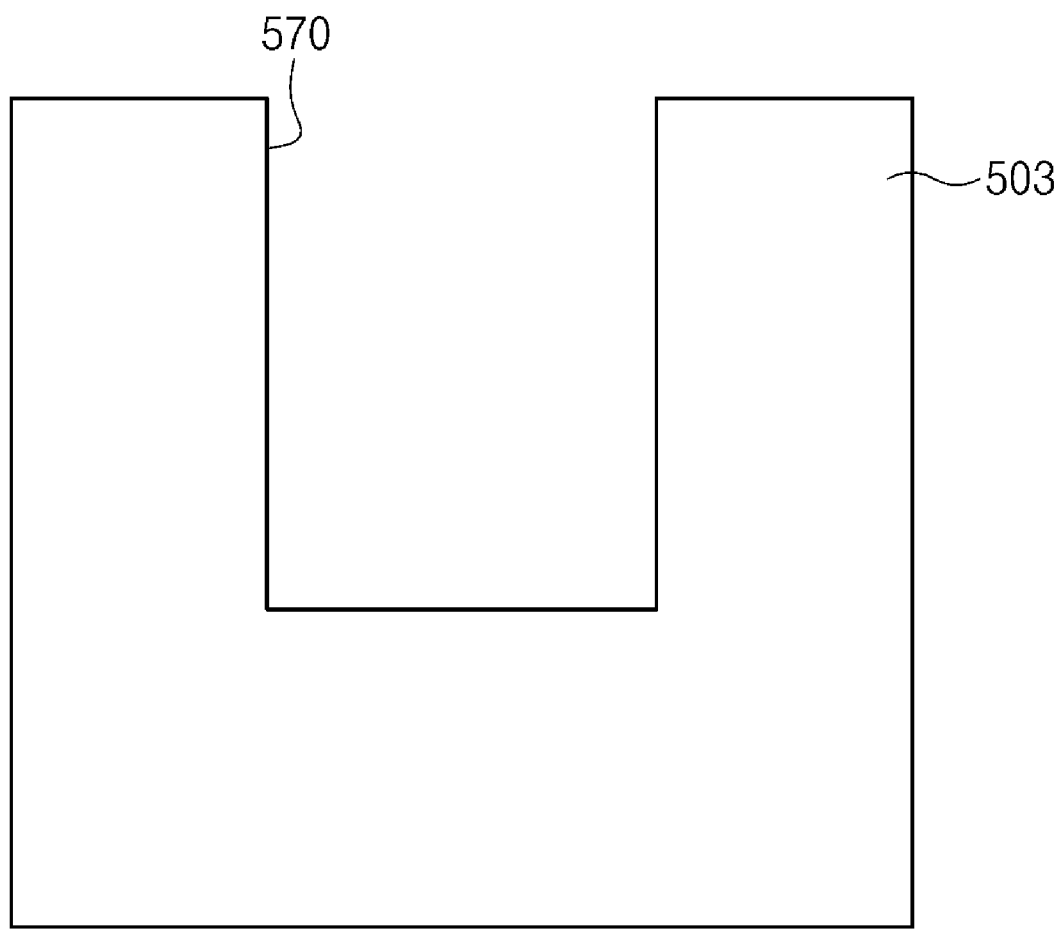

FIG. 14 is a cross-section view taken along line B-B' of the third sheet 503 of FIG. 13. A recess region 570 may be formed in the third sheet 503. The recess region 570 is a portion of a structure in which a first semiconductor chip 601 can be mounted. The recess region 570 may be formed through a punching or a laser processing. Recess regions similar to the recess regions 570 may be formed in the fourth sheet 504, the seventh sheet 507, the eighth sheet 508, the eleventh sheet 511, and the twelfth sheet 512.

Figure 15:
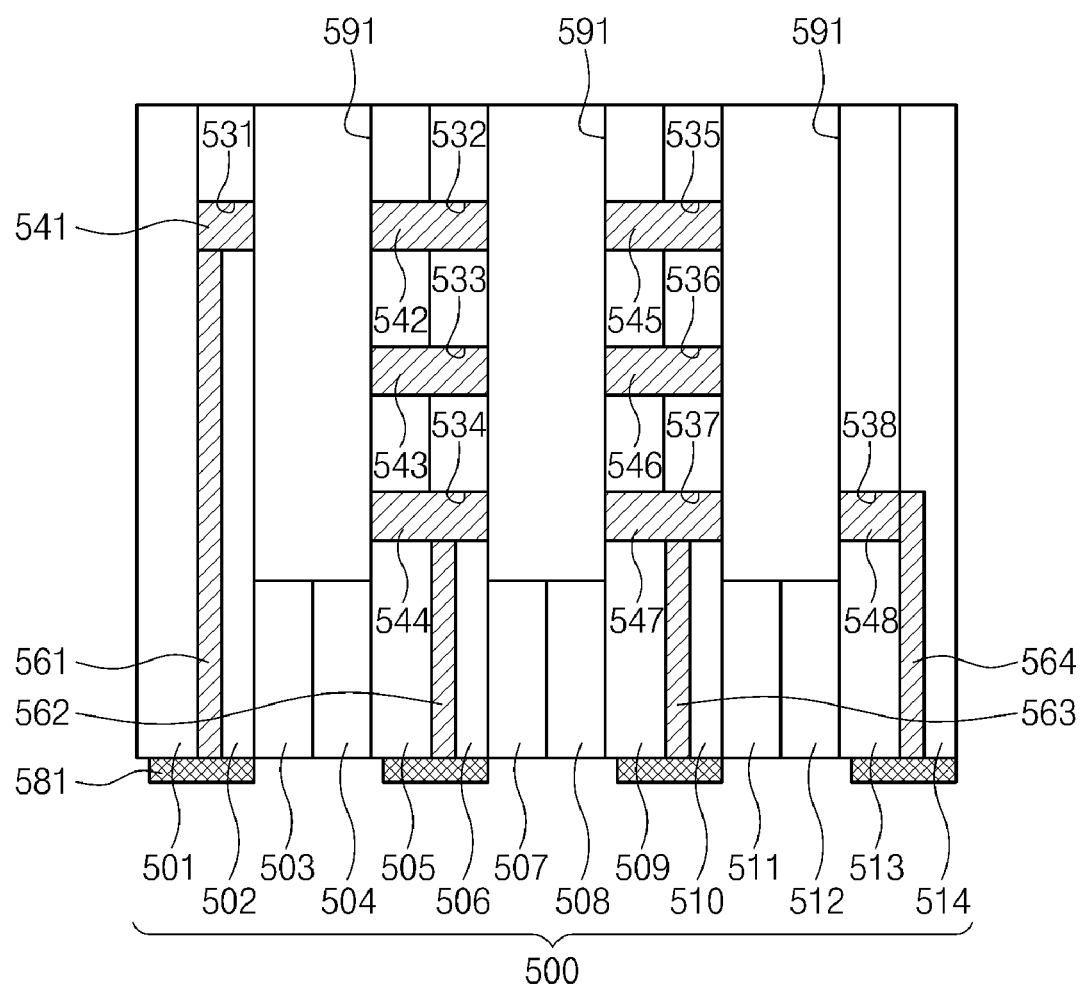

Referring to FIG. 15, a firing process may be performed in a state that the plurality of sheets 501 to 514 are stacked. The firing process may be performed at a low temperature of about 1,000° C. or less like a typical LTCC process. Through the process, a package body 500 may be formed, and the preliminary vias are connected to form second to seventh vias 542 to 547. the recess regions 570 formed in the plurality of sheets may be connected to form an insert slot 591. After the firing process is completed, external connection terminals 581 may be formed on a surface of the package body 500.

Figure 16:
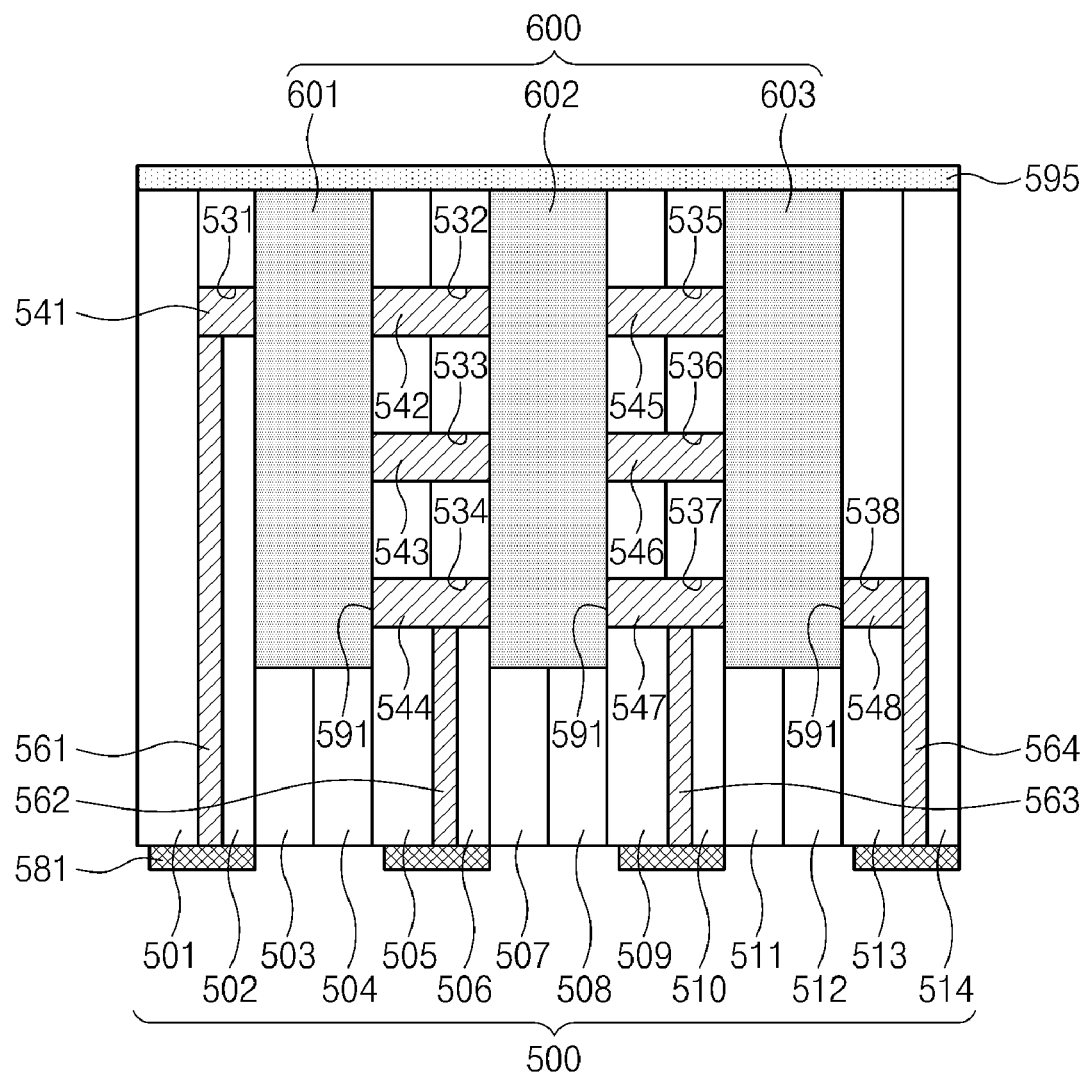

Referring to FIG. 16, a plurality of semiconductor chips 600 may be inserted into the insert slots 591. Pads (not shown) of the plurality of semiconductor chips 600 may be electrically connected to the vias 541 to 548. As an example, before the semiconductor chips 600 are inserted into the insert slots 591 for electrical connection, conductive paste may be coated on the pads of the semiconductor chips 600. The conductive paste serves to connect the plurality of semiconductor chips 600 and the vias 541 to 548 electrically through a heating process.

A protection sheet 595 may be further formed on exposed sides of the plurality of semiconductor chips 600. The protection sheet 595 covers the exposed surface of the plurality of semiconductor chips 600 to protect the plurality of semiconductor chips 600 from the outside. As an example, the protection sheet 595 may be formed of resin. A semiconductor package mounted with the plurality of semiconductor chips 600 may enable electrical connection between the semiconductor chips and the package using conductive metal interconnection, not a bonding wire.

A package can be configured without wire bonding by mounting a plurality of semiconductor chips after an insert slot is formed using an LTCC technology. Also, even when having different sizes and functions, the semiconductor chips can be mounted in one package.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor package comprising:
a package body stacked with a plurality of sheets where conductive patterns and vias are disposed, the package body having a plurality of insert slots, each insert slot extending downward from one surface of the package body on an uppermost sheet, each insert slot going through at least two sheets, including the uppermost sheet and a second uppermost sheet, without discontinuity;
a plurality of semiconductor chips inserted into the insert slots such that each semiconductor chip penetrates at least two sheets; and
an external connection terminal on another surface opposite to the one surface of the package body,
wherein the plurality of semiconductor chips are electrically connected to the external connection terminal.

2. The semiconductor package of claim 1, wherein the vias penetrate the plurality of sheets, and the conductive patterns are provided between the plurality of sheets.

3. The semiconductor package of claim 1, wherein the vias contact the external connection terminal to electrically connect the plurality of semiconductor chips to the external connection terminal.

4. The semiconductor package of claim 3, wherein the conductive patterns connect the plurality of semiconductor chips electrically.

5. The semiconductor package of claim 1, wherein the one surface of the package body exposes one sides of the plurality of semiconductor chips.

6. The semiconductor package of claim 1, wherein the insert slot extends in a direction vertical to the one surface of the package body.

7. The semiconductor package of claim 5, further comprising a protection sheet provided on the one surface of the package body to cover all of the plurality of insert slots.

8. The semiconductor package of claim 1, wherein at least one of the plurality of semiconductor chips has a different size or function.

9. The semiconductor package of claim 1, wherein the insert slots are provided between the plurality of sheets.

10. The semiconductor package of claim 9, wherein the conductive pattern contacts the external connection terminal to electrically connect the plurality of semiconductor chips to the external connection terminal.

11. The semiconductor package of claim 9, wherein the vias connect the plurality of semiconductor chips electrically.

12. The semiconductor package of claim 1, wherein the plurality of sheets are Low Temperature Cofired Ceramic (LTCC) green sheets.

13. The semiconductor package of claim 1, wherein each semiconductor chip penetrates the uppermost sheet and the second uppermost sheet.

* * * * *